United States Patent [19]
Torii

[11] Patent Number: 5,693,550
[45] Date of Patent: Dec. 2, 1997

[54] METHOD OF FABRICATING SELF-ALIGNED SILICIDE DEVICE USING CMP

[75] Inventor: Kozi Torii, Tokyo, Japan

[73] Assignee: NEC Corporation, Japan

[21] Appl. No.: 739,889

[22] Filed: Oct. 31, 1996

[30] Foreign Application Priority Data

Nov. 20, 1995 [JP] Japan ................... 7-301650

[51] Int. Cl.$^6$ ................... H01L 21/265
[52] U.S. Cl. ................... 437/41; 437/200; 437/228
[58] Field of Search ................... 437/41, 44, 200, 437/228; 156/636.1; 216/89

[56] References Cited

U.S. PATENT DOCUMENTS

| | | | |
|---|---|---|---|
| 5,286,678 | 2/1994 | Rastogi | 437/200 |
| 5,472,894 | 12/1995 | Hsu et al. | 437/44 |
| 5,472,897 | 12/1995 | Hsu et al. | 437/44 |
| 5,491,099 | 2/1996 | Hsu | 437/35 |
| 5,508,212 | 4/1996 | Wang et al. | 437/24 |
| 5,567,651 | 10/1996 | Berti et al. | 437/200 |
| 5,576,227 | 11/1996 | Hsu | 437/35 |
| 5,607,884 | 3/1997 | Byun | 437/41 |

OTHER PUBLICATIONS

"Study of the Rapid Thermal Nitridation and Silicidation of Ti using Elastic Recoil Detection. II. Ti on SiO$_2$" Krooshof et al J. Appl. Phys. 63 (10), May 15, 1988; 1988 Institute of Physics; pp. 5110–5114.

"Titanium Disilicide Self–Aligned Source/Drain+Gate Technology" Lau et al IEEE; 1982; pp. 714–717, month unknown.

Primary Examiner—John Niebling
Assistant Examiner—Richard A. Booth
Attorney, Agent, or Firm—Hayes, Soloway, Hennessey, Grossman & Hage, P.C.

[57] ABSTRACT

A titanium film and a polysilicon film are caused to react with each other to produce a TiSi$_2$ layer of silicide. Thereafter, an upper end of a side wall is polished off to remove an electrically conductive TiSix layer which has been formed on the upper end of the side wall at the same time that the silicide has been formed. It is thus possible to keep low the layer resistance of the silicide layer on a gate electrode and a source-drain region and to prevent the source-drain region and the gate electrode from being short-circuited.

4 Claims, 8 Drawing Sheets 5,693,550

METHOD OF FABRICATING SELF-ALIGNED SILICIDE DEVICE USING CMP

BACKGROUND OF THE INVENTION

1. Field of the Invention

The present invention relates to a method of fabricating a semiconductor device, and more particularly to a method of fabricating a semiconductor device according to a self-aligned-silicide process.

2. Description of the Related Art

Insulated-gate field-effect transistors (hereinafter referred to as "MOSFETs") are fabricated in more highly integrated configurations and finer patterns, which creates parasitic resistance of the gate electrodes and source-drain regions of the MOSFETs responsible for thwarting efforts to achieve high-speed operation of semiconductor devices.

To reduce the parasitic resistance, there has been employed a self-aligned-silicide process for forming a self-alinged silicide of refractory metal on the gate electrodes and source-drain regions of MOSFETs.

A method of fabricating a semiconductor device according to a conventional self-aligned-silicide process will be described below.

FIGS. 1(a) through 1(e) and FIGS. 2(a) and 2(b) of the accompanying drawings show a method of fabricating an N-channel MOSFET on a 0.35 μm scale according to a conventional self-aligned-silicide process. FIG. 2(a) is an enlarged view of a structure shown in FIG. 1(d), and FIG. 2(b) is an enlarged view of a structure shown in FIG. 1(e).

First, an element separating region 502 is formed on a semiconductor substrate 501. Thereafter, a gate oxide film 503 is formed on the semiconductor substrate 501 by a thermal oxidation process.

Then, a polysilicon film 504 is deposited to a thickness of about 150 nm on the gate oxide film 503 by CVD (chemical vapor deposition). Subsequently, the assembly is heated at a temperature of about 850° C. in an atmosphere of $POCl_3$ for 20 minutes, diffusing phosphorus into the polysilicon film 504 at a rate of $10^{20}$ $cm^{-3}$.

Thereafter, an unwanted portion of the polysilicon film 504 is removed by photolithography and dry etching, forming a gate electrode.

Then, in order to form a lightly doped drain (LDD) structure, phosphorus is introduced into the semiconductor substrate 501 at a dose of $3 \times 10^{13}$ $cm^{-2}$ with an energy of 50 KeV by way of ion implantation, thereby forming a shallow impurity-diffused region 505 of low density (see FIG. 1(a)).

Then, a silicon oxide film having a thickness of about 150 nm is deposited by CVD on a substrate surface where an element region is formed, after which the silicon oxide film is anisotropically etched by reactive ion etching, leaving the silicon oxide film only on a side surface of the polysilicon film 504 thereby to form a side wall 506.

Then, arsenic is introduced into the semiconductor substrate 501 at a dose of $2 \times 10^{15}$ $cm^{-2}$ with an energy of 70 KeV by way of ion implantation, and the assembly is heated for activation at a temperature of about 850° C. in a nitrogen atmosphere, forming a self-aligned source-drain region 507. Now, an LDD structure is formed by the shallow impurity-diffused region 505 of low density (see FIG. 1(b)).

Then, the assembly is immersed in an aqueous solution containing a hydrofluoric acid to remove a natural oxide film from the surfaces of the silicon film 504 and the source-drain region 507. Thereafter, a titanium film 508 having a thickness of about 35 nm is deposited on the silicon film 504 and the source-drain region 507 by sputtering.

Subsequently, in a first heat treatment process, the assembly is heated at a temperature of about 650° C. for 30 seconds, causing the titanium of the titanium film 508 and the silicon of the source-drain region 507 and the polysilicon film 504 to react with each other for thereby forming a $TiSi_2$ layer 509 of silicide having a C49 structure on the source-drain region 507 and the polysilicon film 504.

At the same time, the side wall 506 composed of a silicon oxide film and the titanium film 508 react with each other, forming a TiSix layer 510 on the surface of the side wall 506 (see FIG. 1(c)).

The assembly is then immersed in a mixed solution of sulfuric acid and hydrogen peroxide to remove the titanium film 508 which has remained unreacted. If the assembly is heated in a nitrogen atmosphere in the first heat treatment, then the outermost surface of the unreacted titanium film 508 comprises a titanium nitride layer, which is etched away by the mixed solution.

Since the $TiSi_2$ layer 509 and the TiSix layer 510 are not etched by the mixed solution of sulfuric acid and hydrogen peroxide, they remain unremoved. The thickness of the $TiSi_2$ layer 509 on the source-drain region 507 and the polysilicon film 504 and the thickness of the TiSix layer 510 on the side wall 506 are substantially the same as the thicknesses at the time of the reaction (see FIGS. 1(d) and 2(a)). The TiSix layer 510 remains on the side wall 506.

Since the TiSix layer 510 is electrically conductive, the TiSix layer 510 on the side wall 506 tends to cause a short circuit between the gate electrode and the source-drain region 507.

To avoid the above shortcoming, the assembly is immersed in a mixed solution of ammonia and hydrogen peroxide, thereby etching away the TiSix layer 510.

Simultaneously, portions of the $TiSi_2$ layer 509 and the side wall 506 are also etched away (see FIGS. 1(e) and 2(b)).

A structure which is the same as described above will be produced when the assembly is treated only with a mixed solution of ammonia and hydrogen peroxide.

Then, in a second heat treatment process, the assembly is heated at a temperature of about 900° C. for 10 seconds to change the $TiSi_2$ layer 509 from the C49 structure to a C54 structure of lower resistance by way of phase transition.

Thereafter, an interlayer film is formed, contact holes are defined, and interconnections are formed in the same manner as with the ordinary method of fabricating a MOSFET, thus producing an N-channel MOSFET with a silicide.

When the TiSix layer on the side wall is removed, the thickness of the $TiSi_2$ layer on the gate electrode and the source-drain region is simultaneously reduced by the etching.

Therefore, it is difficult to prevent a short circuit from occurring between the source-drain region and the gate electrode while keeping low the layer resistance of the $TiSi_2$ layer on the gate electrode and the source-drain region.

In the first heat treatment process, as the temperature is lower, the TiSix layer is less liable to be formed. Therefore, it may be possible to avoid the formation of the TiSix layer by fabricating the semiconductor device at a low temperature. At a low temperature, however, the reaction of the $TiSi_2$ layer on the gate electrode and the source-drain region is suppressed, and the resistance of the $TiSi_2$ layer remains high. Accordingly, a short circuit between the source-drain region and the gate electrode and the layer resistance of the $TiSi_2$ layer are in a trade-off relationship to each other.

The silicon oxide film and the titanium film react when heated to 500° C. or higher, forming TiSix (see J. Electronchem. Soc., December 1984, Vol. 131, No. 12, pp. 2934–2938). Therefore, insofar as the silicon oxide film is applied as the side wall, it is difficult to prevent the source-drain region and the gate electrode from being short-circuited by the TiSix layer.

Silicide reaction may be suppressed by constructing the side wall as a nitride film. However, the characteristics of the gate insulating film are lowered due to residual stresses developed by the nitride film.

SUMMARY OF THE INVENTION

It is an object of the present invention to provide a method of fabricating a semiconductor device in a manner to keep low the layer resistance of a silicide layer formed on a gate electrode and a source-drain region without lowering the characteristics of a gate insulating film, and to prevent the source-drain region and the gate electrode from being short-circuited.

To achieve the above object, there is provided in accordance with the present invention a method of fabricating a semiconductor device having a gate electrode and a source-drain region on a semiconductor substrate, comprising the steps of:

forming a gate oxide film and a gate electrode on a semiconductor substrate;

thereafter, forming a side wall on a side surface of the gate electrode;

thereafter, forming a self-aligned source-drain region while using the gate electrode and the side wall as a mask;

thereafter, forming a refractory metal film on an entire surface of the semiconductor substrate;

thereafter, causing the refractory metal film and silicon to react with each other, producing a silicide;

thereafter, removing a portion of the refractory metal film which has not reacted with the silicon; and thereafter, polishing off an upper end of the side wall.

The above object can also be achieved by fabricating the semiconductor device by the same method, except that said side wall comprises a silicon film.

According to the present invention, there is also provided a method of fabricating a semiconductor device having a gate electrode and a source-drain region on a semiconductor substrate, comprising the steps of:

forming a gate oxide film and a gate electrode on a semiconductor substrate;

thereafter, forming a side wall on a side surface of the gate electrode;

thereafter, forming a self-aligned source-drain region while using the gate electrode and the side wall as a mask;

thereafter, forming a refractory metal film on an entire surface of the semiconductor substrate;

thereafter, causing the refractory metal film and silicon to react with each other, producing a silicide;

thereafter, polishing off an upper end of the side wall; and thereafter, removing a portion of the refractory metal film which has not reacted with the silicon.

And said side wall may also comprise a silicon film.

According to above methods, a titanium film and a polysilicon film are caused to react with each other to produce a TiSi$_2$ layer of silicide. Thereafter, an upper end of a side wall is polished off to remove an electrically conductive TiSix layer which has been formed on the upper end of the side wall at the same time that the silicide has been formed.

Since the TiSix layer which is responsible for developing a short circuit between a gate electrode and a source-drain region is removed, the thicknesses of the silicide layer and the layer of the source-drain region are not reduced as the TiSix layer is removed, and hence the layer resistance is made low.

The above and other objects, features, and advantages of the present invention will become apparent from the following description with reference to the accompanying drawings which illustrate examples of the present invention.

DETAILED DESCRIPTION OF THE PREFERRED EMBODIMENTS

1st Embodiment

Figure 1A:
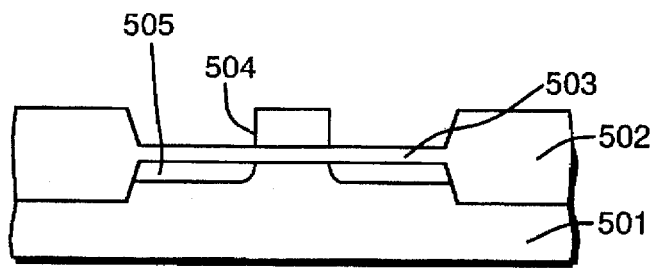
FIGS. 1(a) through 1(e) are fragmentary cross-sectional views showing a method of fabricating an N-channel MOSFET on a 0.35 µm scale according to a conventional self-aligned-silicide process.
Figure 1B:
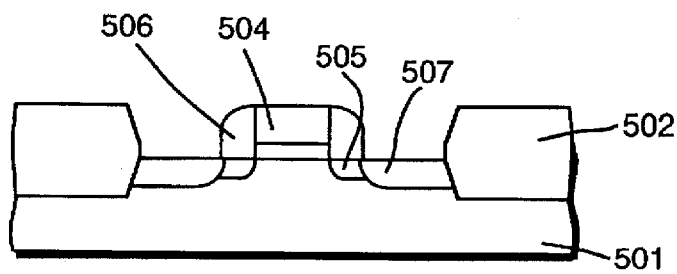
Figure 1C:
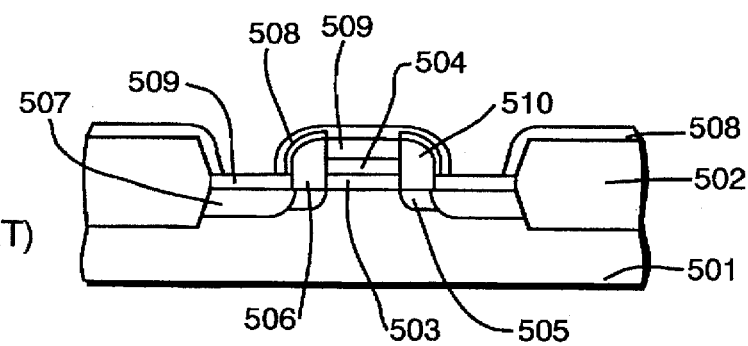
Figure 1D:
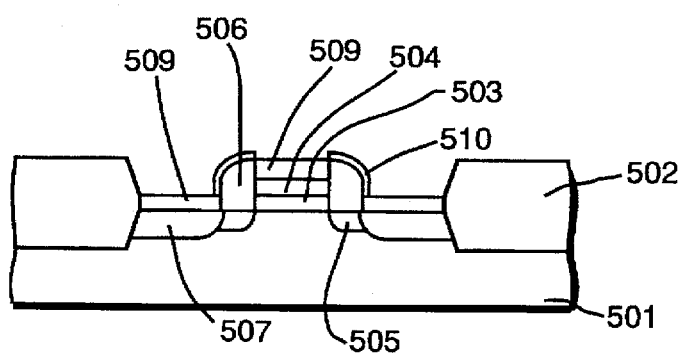
Figure 1E:
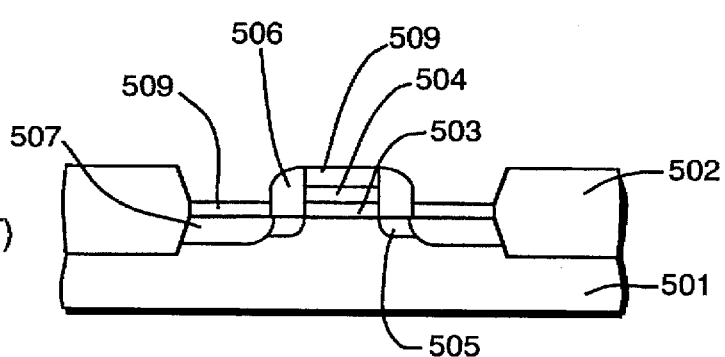
Figure 2A:
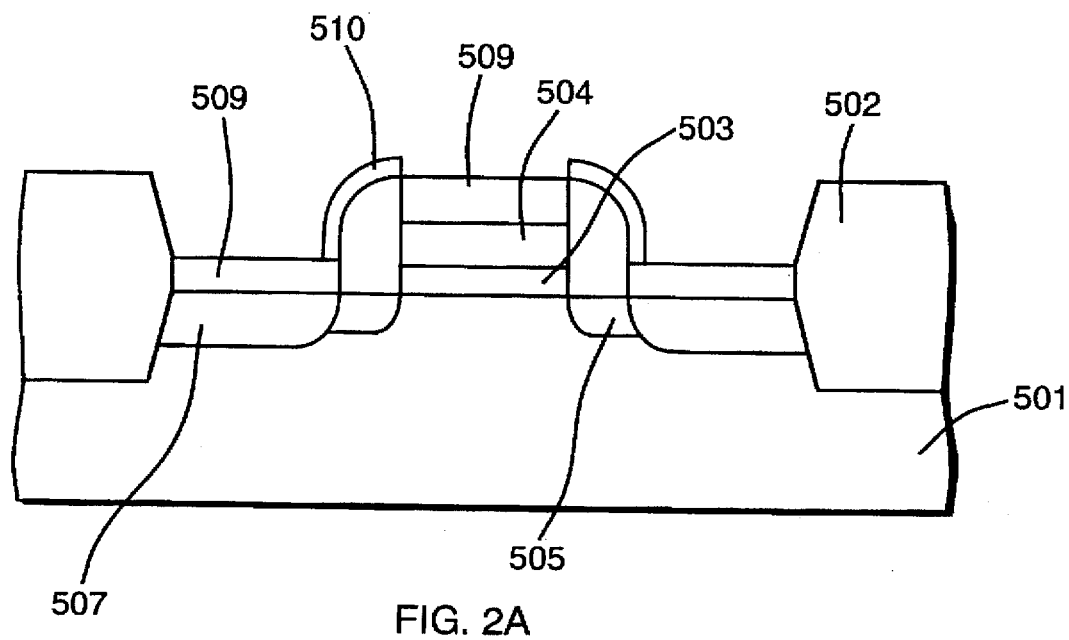
FIGS. 2(a) and 2(b) are enlarged fragmentary cross-sectional views of respective structures shown in FIGS. 1(d) and 1(e)
Figure 2B:
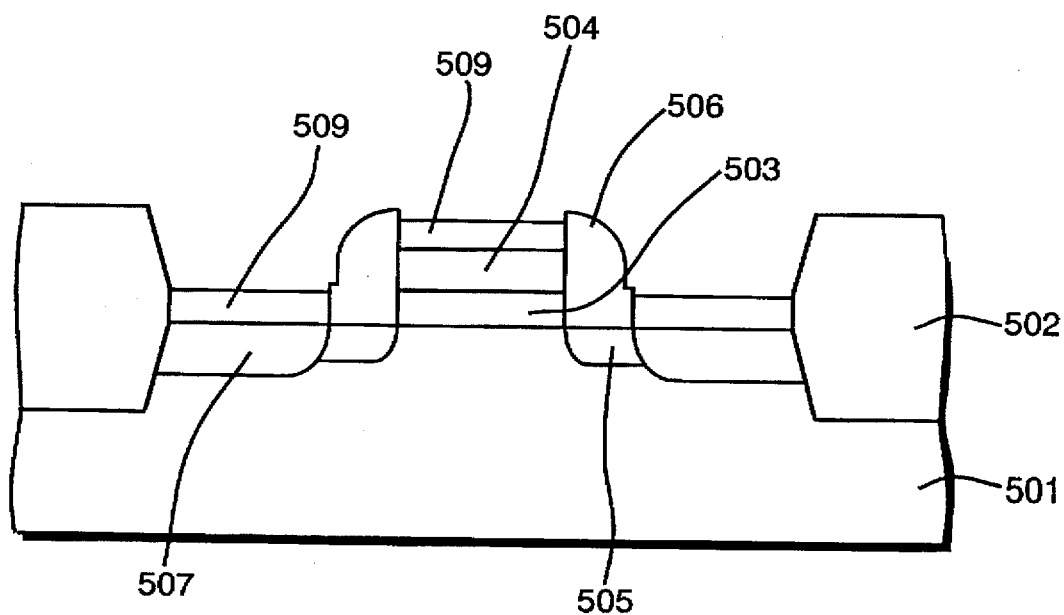

FIGS. 3(a) through 3(d) show a method of fabricating a semiconductor device according to a first embodiment of the present invention.

First, an element separating region 2 having a thickness of about 500 nm is formed on a P-type region of a semiconductor substrate 1 of single-crystal silicon. Thereafter, a gate oxide film 3 having a thickness of about 8 nm is formed on the semiconductor substrate 1.

Further, the form and thickness of an element separating region doesn't limit the above embodiment.

Then, a polysilicon film 4 is deposited to a thickness of about 150 nm on the gate oxide film 3 by CVD. Subsequently, the assembly is heated in an atmosphere of $PoCl_3$, introducing an N-type impurity of phosphorus into the polysilicon film 4 at a rate of $10^{20}$ $cm^{-3}$.

Thereafter, an unwanted portion of the polysilicon film 4 is removed by photolithography and dry etching, forming a gate electrode.

Then, in order to form an LDD structure, phosphorus is introduced into the semiconductor substrate 1 at a dose of $3\times10^{13}$ $cm^{-2}$ with an energy of 50 KeV by way of ion implantation, thereby forming a shallow impurity-diffused region 5 of low density.

Then, a silicon oxide film having a thickness of about 150 nm is deposited by CVD on a substrate surface where an element region is formed, after which the silicon oxide film is anisotropically etched by reactive ion etching, leaving the silicon oxide film only on a side surface of the polysilicon film 4 thereby to form a side wall 6.

Then, arsenic is introduced into the semiconductor substrate 1 at a dose of $2\times10^{15}$ $cm^2$ with an energy of 70 KeV by way of ion implantation, and the assembly is heated for activation at a temperature of about 850° C. in a nitrogen atmosphere, forming a self-aligned source-drain region 7. Now, an LDD structure is formed by the shallow impurity-diffused region 5 of low density (see FIG. 3(a)).

Then, the assembly is immersed in an aqueous solution containing a hydrofluoric acid to remove a natural oxide film from the surfaces of the silicon film 4 and the source-drain region 7. Thereafter, a titanium film 8, i.e., a refractory metal film, having a thickness of about 35 nm is deposited on the silicon film 4 and the source-drain region 7 by sputtering.

Subsequently, in a first heat treatment process, the assembly is heated at a temperature of about 650° C. for 30 seconds, causing the titanium of the titanium film 8 and the silicon of the source-drain region 7 and the polysilicon film 4 to react with each other for thereby forming a $TiSi_2$ layer 9 of silicide having a C49 structure on the source-drain region 7 and the polysilicon film 4.

Figure 3A:
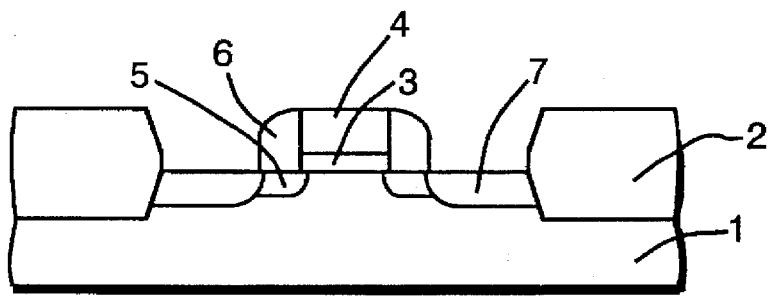
FIGS. 3(a) through 3(d) are fragmentary cross-sectional views showing a method of fabricating a semiconductor device according to a first embodiment of the present invention.
Figure 3B:
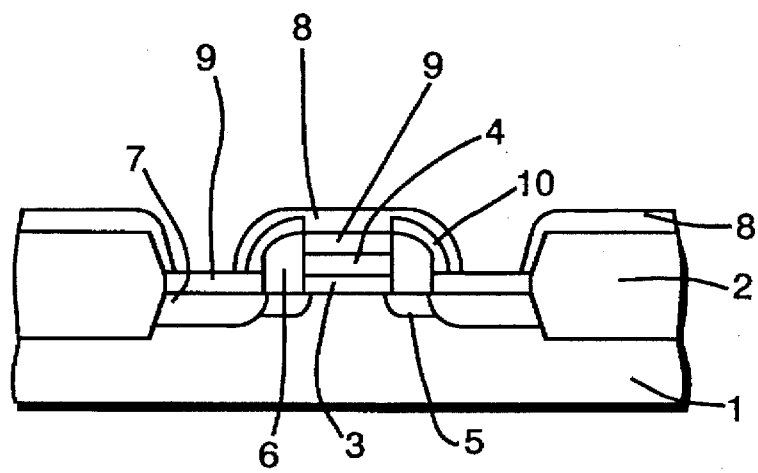

At the same time, the side wall 6 composed of a silicon oxide film and the titanium film 8 react with each other, forming a TiSix layer 10 on the surface of the side wall 6 (see FIG. 3(b)). If the assembly is heated in a nitrogen atmosphere, then a titanium nitride layer is formed.

The assembly is then immersed in a mixed solution of sulfuric acid and hydrogen peroxide at a ratio of 4:1 at a temperature of about 130° C. for 10 minutes to remove the titanium film 8 or the titanium nitride layer which has remained unreacted. Since the $TiSi_2$ layer 9 and the TiSix layer 10 are not etched by the mixed solution of sulfuric acid and hydrogen peroxide, the thicknesses of the $TiSi_2$ layer 9 and the TiSix layer 10 are substantially the same as their thicknesses at the time they are formed (see FIG. 3(c)).

Then, the surface of the assembly is polished. Thereafter, in a second heat treatment process, the assembly is heated at a temperature of about 900° C. for 10 seconds to change the $TiSi_2$ layer 9 from the C49 structure to a C54 structure of lower resistance by way of phase transition.

Figure 3C:
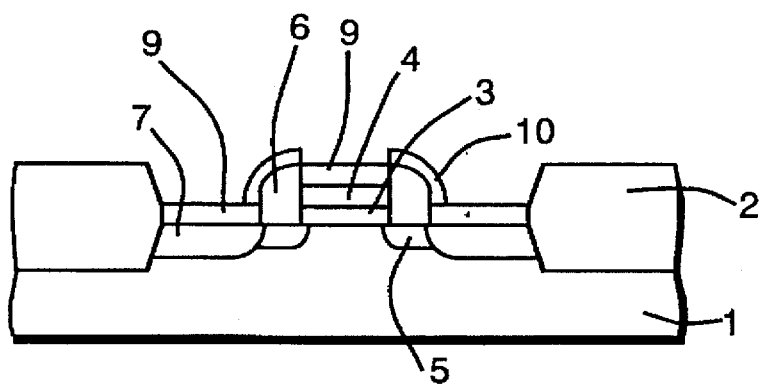
Figure 3D:
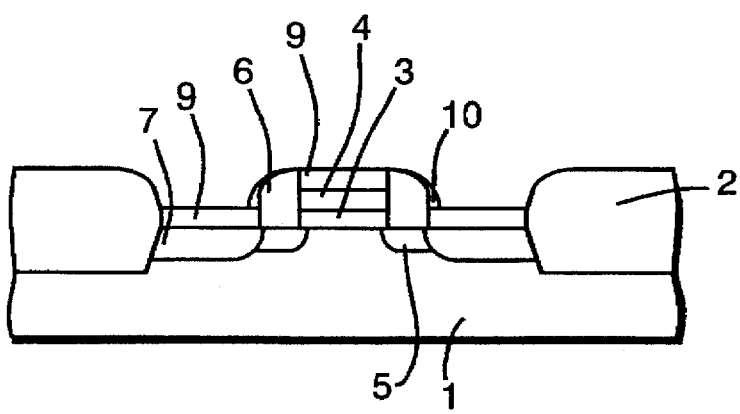

Thereafter, an interlayer film is formed, contact holes are defined, and interconnections are formed in the same manner as with the ordinary method of fabricating a MOSFET, thus producing an N-channel MOSFET with a silicide (see FIG. 3(d)).

A process of polishing the semiconductor device will be described below.

Figure 4:
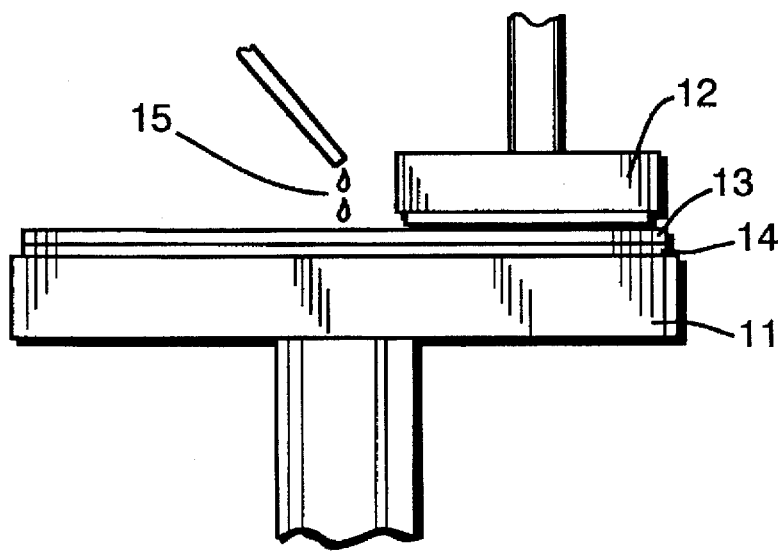
FIG. 4 is a front elevational view of a polishing device used in a step shown in FIG. 3(d)

FIG. 4 shows a polishing device used in the step shown in FIG. 3(d).

As shown in FIG. 4, the polishing device compises a rotatable turntable 11, a polishing pad comprising a foamed polyurethane layer 13 of high hardness and a nonwoven cloth 14 of low hardness, and a rotatable carrier 12 for holding a semiconductor device. The polishing pad is supplied with an abrasive solution 15.

The polishing device operates as follows:

A semiconductor device with its surface to be polished facing the polishing pad is mounted on the carrier 12, and thereafter the carrier 12 is moved toward the turntable 11 and pressed thereagainst.

Then, the abrasive solution 15 is supplied onto the polishing pad, and at the same time the turntable 11 and the carrier 12 are rotated to polish the semiconductor device.

The polishing device is used to planarize the interlayer film. If the semiconductor device which is being polished has a protrusion, then stresses tend to concentrate on the protrusion.

Figure 5:
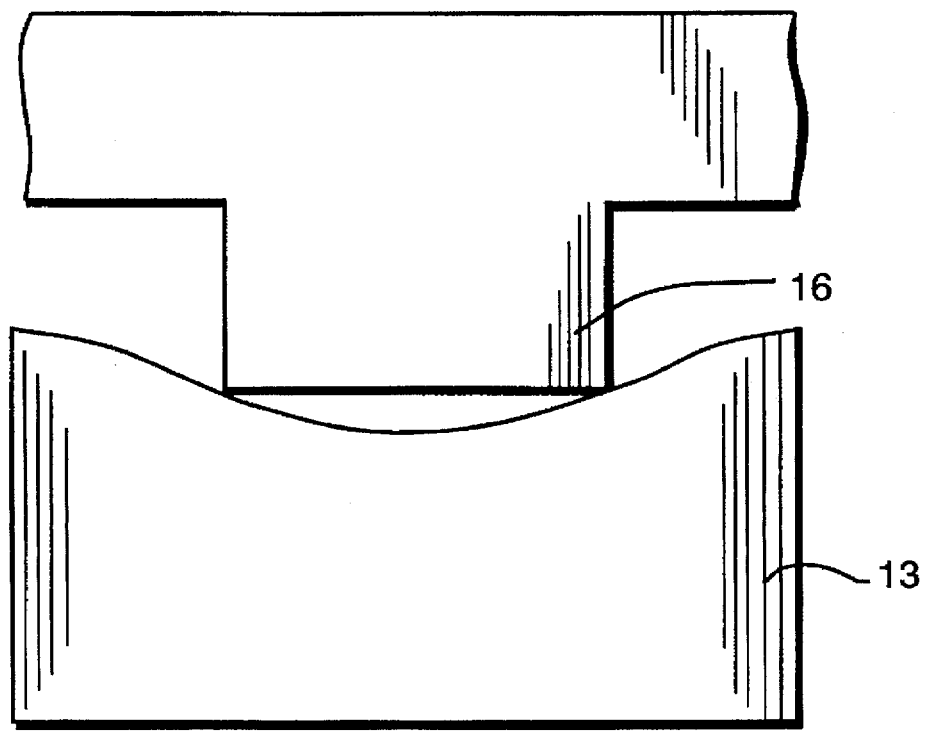
FIG. 5 is an enlarged view illustrative of an interaction between a polishing pad and a protrusion on a semiconductor device being polished by the polishing device shown in FIG. 4.

FIG. 5 illustrates an interaction between the polishing pad and a protrusion 16 on the semiconductor device being polished by the polishing device shown in FIG. 4.

As shown in FIG. 5, when the semiconductor device with the protrusion 16 is pressed against the polishing pad, the outermost foamed polyurethane layer 13 is deformed by the protrusion 16, though it is highly hard, under compressive forces in its region which is held in contact with the protrusion 16. However, the foamed polyurethane layer 13 is not locally deformed into a shape exactly complementary to the protrusion 16.

Therefore, stresses are applied from the foamed polyurethane layer 13 to concentrate on corners of the protrusion 16. Such a phenomenon is shown in FIG. 6 of A NOVEL OPTIMIZATION METHOD OF CHEMICAL MECHANICAL POLISHING, VMIC' 95, collected preprints pp. 464–470, for example.

Based on the above phenomenon, the TiSx layer 10 (see FIGS. 3(c)) on the upper end of the side wall 6 is selectively removed.

Figure 6:
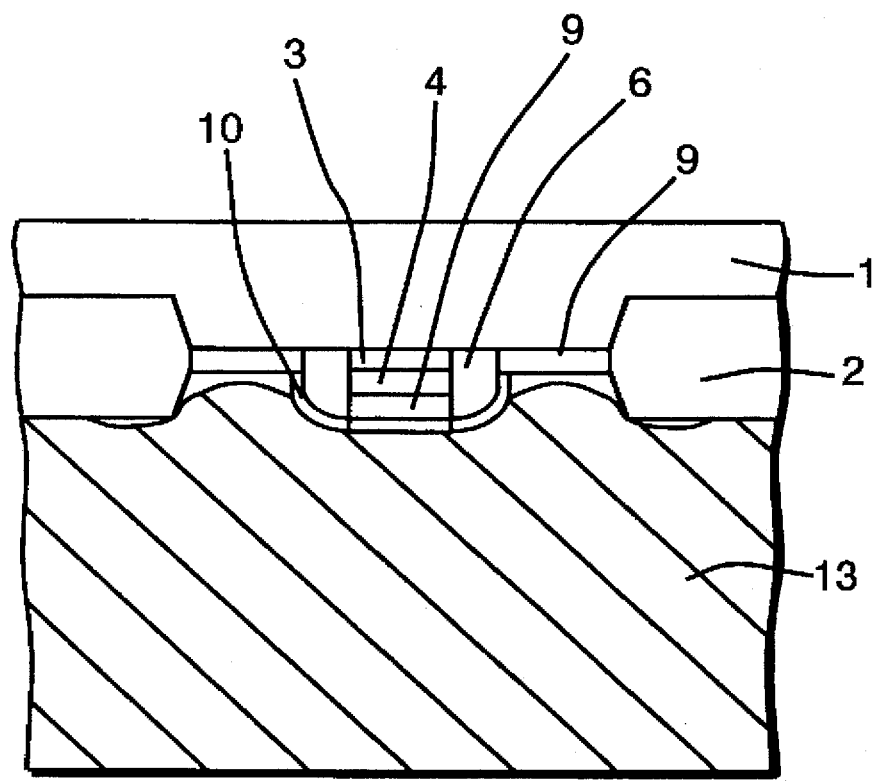
FIG. 6 is a fragmentary cross-sectional view showing the manner in which a semiconductor device is pressed against the polishing device shown in FIG. 4.

FIG. 6 shows the manner in which the semiconductor device is pressed against the polishing device shown in FIG. 4.

As shown in FIG. 6, when the semiconductor device is pressed against the polishing device, stresses concentrate on a portion of the element separating region 2 and the upper end of the side wall 6, thereby polishing them.

The semiconductor device is polished by the polishing device under a load of 250 g/cm² while the carrier 12 (FIG. 4) is being rotated at 20 r.p.m. and the turntable 11 (FIG. 4) is being rotated at 20 r.p.m. The abrasive solution 15 (FIG. 4) comprises an aqueuous solution containing 5–15 wt % of silica particles and having a pH ranging from 7 to 11.5. The pH should preferably be adjusted with $NH_4OH$.

When the semiconductor device is polished by the polishing device, the side wall 6 is polished a thickness of about 10 nm for a period of time ranging from about 10 to 30 seconds.

In the above polishing process, since the rate at which the upper end of the side wall 6 is polished is 2 to 3 times greater than the rate at which the central region of the gate electrode is polished, the TiSi$_2$ layer on the gate electrode is removed at a rate which is ½–⅓ of the conventional rate, and the diffused layer is almost not polished.

Thereafter, the semiconductor device is pressed against a nonwoven cloth (not shown) of low hardness while deionized water is being supplied to the nonwoven cloth, and the same rotary motion as described above is imparted to the semiconductor device to remove the abrasive solution therefrom.

Figure 7A:
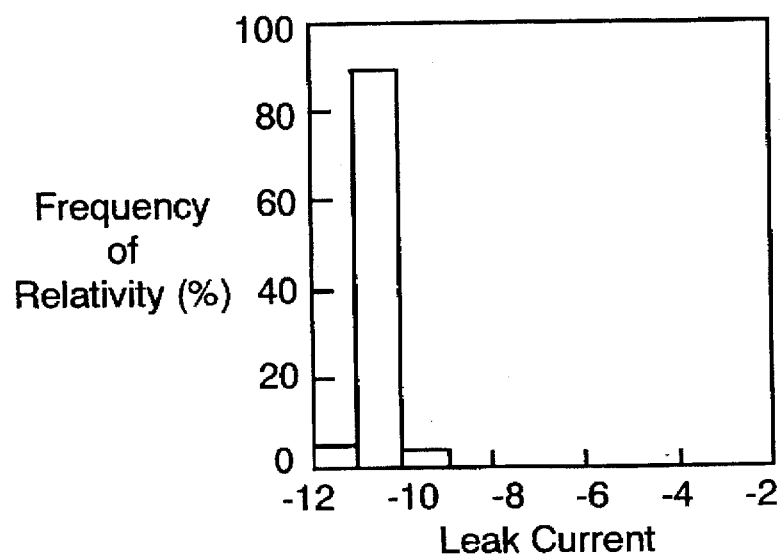
FIG. 7(a) is a graph showing a leak current flowing when a voltage of 4V is applied between a gate electrode and a source-drain region of a semiconductor device fabricated by the method according to the first embodiment of the present invention.
Figure 7B:
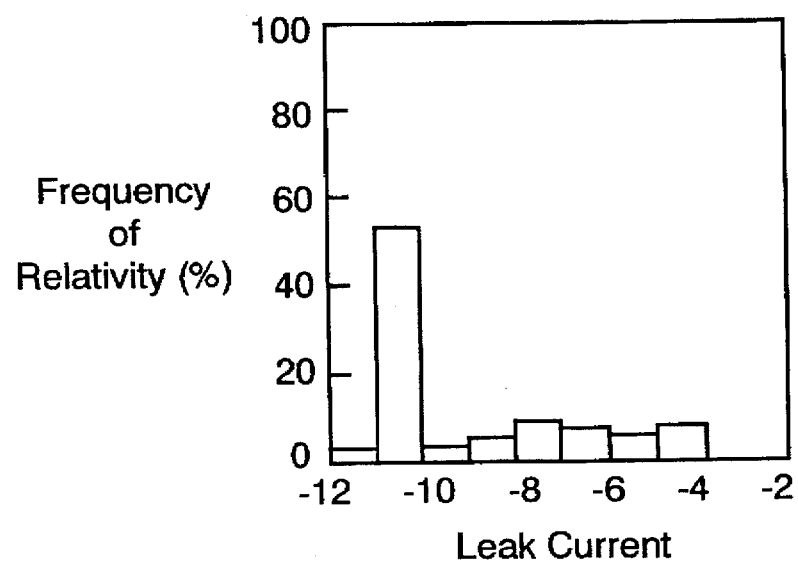
FIG. 7(b) is a graph showing a leak current flowing when a voltage of 4V is applied between a gate electrode and a source-drain region of a semiconductor device fabricated by a conventional method.

FIGS. 7(a) and 7(b) show leak currents flowing when a voltage of 4V is applied between gate electrodes and source-drain regions of semiconductor devices fabricated by the method according to the first embodiment of the present invention and a conventional method, respectively.

As shown in FIGS. 7(a) and (b), the semiconductor device fabricated by the conventional method causes leak currents of $10^{-8}$ [A] and greater, indicating a short circuit developed between the gate electrode and the source-drain region.

The semiconductor device fabricated by the method according to the first embodiment, however, causes only leak currents of about $10^{-10}$ [A], indicating no short circuit developed between the gate electrode and the source-drain region.

Figure 8A:
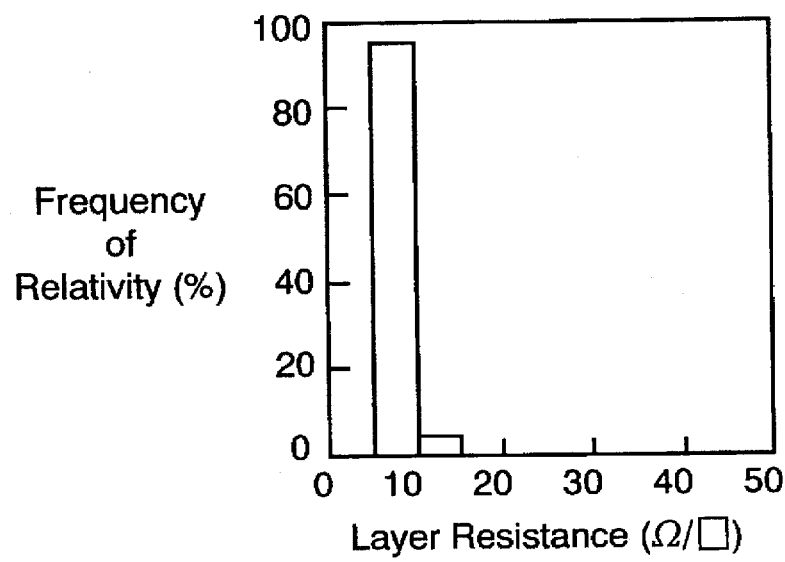
FIG. 8(a) is a graph showing a layer resistance of the semiconductor device fabricated by the method according to the first embodiment of the present invention.
Figure 8B:
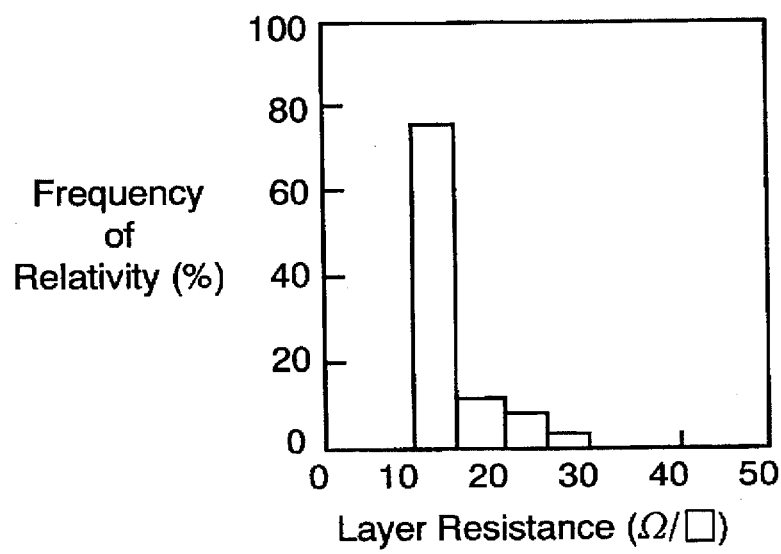
FIG. 8(b) is a graph showing a layer resistance of the semiconductor device fabricated by the conventional method.

FIGS. 8(a) and 8(b) show layer resistances of the semiconductor devices fabricated by the method according to the first embodiment of the present invention and the conventional method.

As shown in FIGS. 8(a) and 8(b), the semiconductor device fabricated by the method according to the first embodiment has a stabler layer resistance of the gate electrode than the semiconductor device fabricated by the conventional method.

This holds true also for the layer resistance of the source-drain region.

According to the first embodiment of the present invention, as described above, it is possible to suppress a short circuit between the gate electrode and the source-drain region and to keep low the layer resistance of the TiSi$_2$ layer.

The present invention is also applicable to the formation of a refractory metal silicide such as NiSi$_2$, COSi$_2$, or the like.

2nd Embodiment

FIGS. 9(a) through 9(d) show a method of fabricating a semiconductor device according to a second embodiment of the present invention.

Figure 9A:
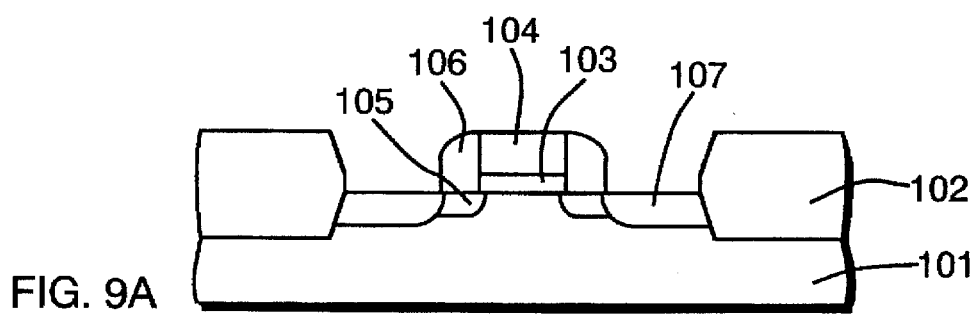
FIGS. 9(a) through 9(d) are fragmentary cross-sectional views showing a method of fabricating a semiconductor device according to a second embodiment of the present invention.
Figure 9B:
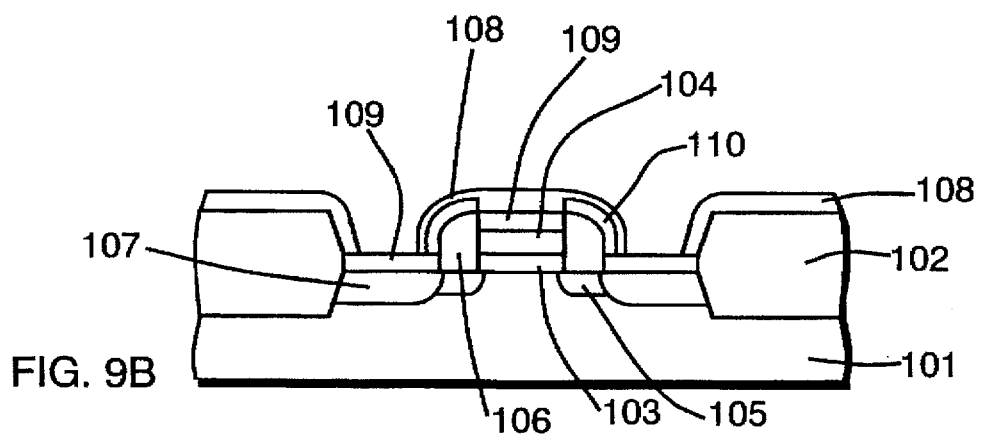

The method according to the second embodiment is the same as the method according to the first embodiment until a titanium film 108 is formed and the assembly is heated in a first low-temperature heat treatment process (see FIGS. 9(a) and 9(b)).

Figure 9C:
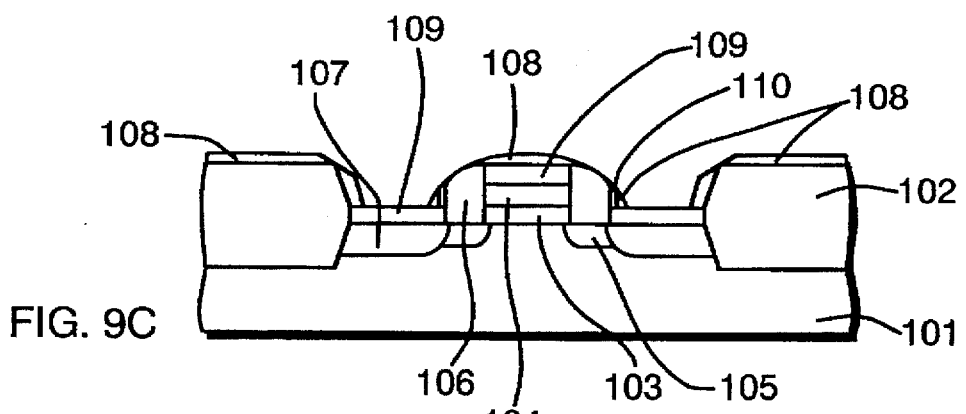

The surface of the assembly is polished in the same manner as with the method according to the first embodiment (see FIG. 9(c)).

Figure 9D:
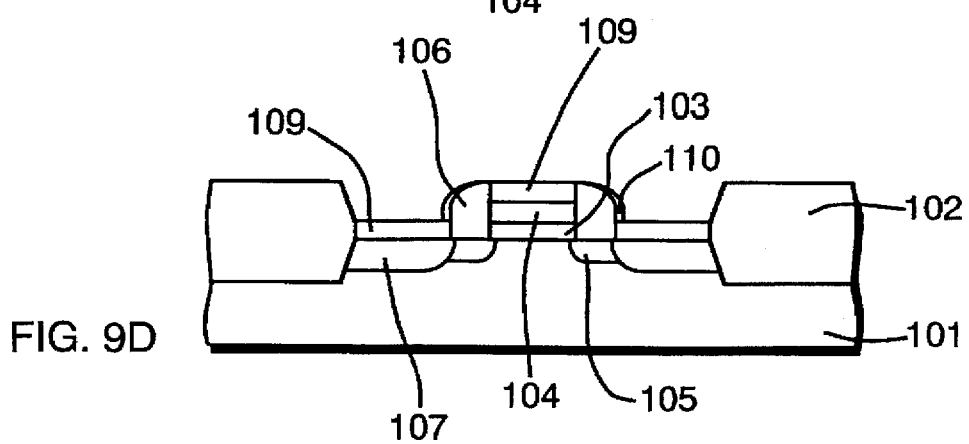

The polished assembly is then immersed in a mixed solution of sulfuric acid and hydrogen peroxide at a ratio of 4:1 at a temperature of about 130° C. for 10 minutes (see FIG. 9(d)).

Thereafter, the assembly is heated at a temperature of about 900° C.

Subsequent steps of the method according to the second embodiment are the same as those of the method according to the first embodiment.

According to the second embodiment, since the unreacted titanium film, etc. are removed after the assembly is polished, the probability that foreign matter such as silica particles will remain unremoved is made lower, and the reliability of the semiconductor device is made higher.

With the present invention, as described above, after a refractory metal film and silicon are caused to react with each other to produce a silicide, the upper end of a side wall is polished to remove an electrically conductive TiSix layer which has been formed on the upper end of the side wall at the same time that the silicide has been formed. Consequently, no etching is carried out for the purpose of removing the TiSix layer, and hence the thickness of the silicide layer formed on a gate electrode and a source-drain region is not reduced.

As a result, it is possible to keep low the layer resistance of the silicide layer on the gate electrode and the source-drain region and to prevent the source-drain region and the gate electrode from being short-circuited while preventing the characteristics of the gate insulating film from being lowered.

It is to be understood that although the characteristics and advantages of the present invention have been set forth in the foregoing description, the disclosure is illustrative only, and changes may be made in the arrangement of the parts within the scope of the appended claims.

What is claimed is:

1. A method of fabricating a semiconductor device having a gate electrode and a source-drain region on a semiconductor substrate, comprising the steps of:

forming a gate oxide film and a gate electrode on a semiconductor substrate;

thereafter, forming a side wall on a side surface of said gate electrode;

thereafter, forming a self-aligned source-drain region while using said gate electrode and said side wall as a mask;

thereafter, forming a refractory metal film on an entire surface of said semiconductor substrate;

thereafter, causing said refractory metal film and silicon to react with each other, producing a silicide;

thereafter, removing a portion of said refractory metal film which has not reacted with said silicon; and thereafter, polishing off an upper end of said side wall.

2. A method according to claim 1, wherein said side wall contains silicon.

3. A method of fabricating a semiconductor device having a gate electrode and a source-drain region on a semiconductor substrate, comprising the steps of:

forming a gate oxide film and a gate electrode on a semiconductor substrate;

thereafter, forming a side wall on a side surface of said gate electrode;

thereafter, forming a self-aligned source-drain region while using said gate electrode and said side wall as a mask;

thereafter, forming a refractory metal film on an entire surface of said semiconductor substrate;

thereafter, causing said refractory metal film and silicon to react with each other, producing a silicide;

thereafter, polishing off an upper end of said side wall; and thereafter, removing a portion of said refractory metal film which has not reacted with said silicon.

4. A method according to claim 3, wherein said side wall contains silicon.

* * * * *